United States Patent [19]
Mueller et al.

[11] Patent Number: 6,069,815
[45] Date of Patent: *May 30, 2000

[54] SEMICONDUCTOR MEMORY HAVING HIERARCHICAL BIT LINE AND/OR WORD LINE ARCHITECTURE

[75] Inventors: Gerhard Mueller; Toshiaki Kirihata, both of Wappingers Falls, N.Y.; Hing Wong, Los Altos, Calif.

[73] Assignees: Siemens Aktiengesellschaft, Munich, Germany; International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,538

[22] Filed: Dec. 18, 1997

[51] Int. Cl.⁷ ..................................................... G11C 5/06
[52] U.S. Cl. ............................................. 365/63; 365/190
[58] Field of Search ............................... 365/63, 72, 190, 365/230.03

[56] References Cited

U.S. PATENT DOCUMENTS

| | | | |
|---|---|---|---|
| 4,977,538 | 12/1990 | Anami et al. | 365/230.03 |
| 4,980,860 | 12/1990 | Houston et al. | 365/63 |
| 5,091,887 | 2/1992 | Asakura | 365/63 |
| 5,107,459 | 4/1992 | Chu et al. | 365/63 |
| 5,136,543 | 8/1992 | Matsuda et al. | 365/190 |
| 5,214,601 | 5/1993 | Hidaka et al. | 365/190 |
| 5,250,831 | 10/1993 | Ishii | 257/354 |
| 5,610,871 | 3/1997 | Hidaka | 365/230.03 |
| 5,815,428 | 9/1998 | Tsuruda et al. | 365/63 |

FOREIGN PATENT DOCUMENTS 09 017974 of 0000 Japan .
WO 97/28532 of 0000 WIPO .

*Primary Examiner*—Tan T. Nguyen
*Attorney, Agent, or Firm*—Stanton C. Braden

[57] ABSTRACT

Disclosed is a semiconductor memory having a hierarchical bit line and/or word line architecture. In one embodiment, a memory having a hierarchical bit line architecture, particularly suitable for cells smaller than $8F^2$, includes a master bit line pair in each column, including first and second master bit lines with portions vertically spaced from one another. The first and second master bit lines twist with respect to one another in the vertical direction such that the first master bit line alternately overlies and underlies the second master bit line. A plurality of local bit line pairs in each column are coupled to memory cells, with at least one of the local bit lines coupled to a master bit line. In other embodiments, hierarchical word line configurations are disclosed including master word lines, sub-master word lines, and local word lines, electrically interconnected to one another via either switches, electrical contacts, or electrical circuits.

16 Claims, 11 Drawing Sheets

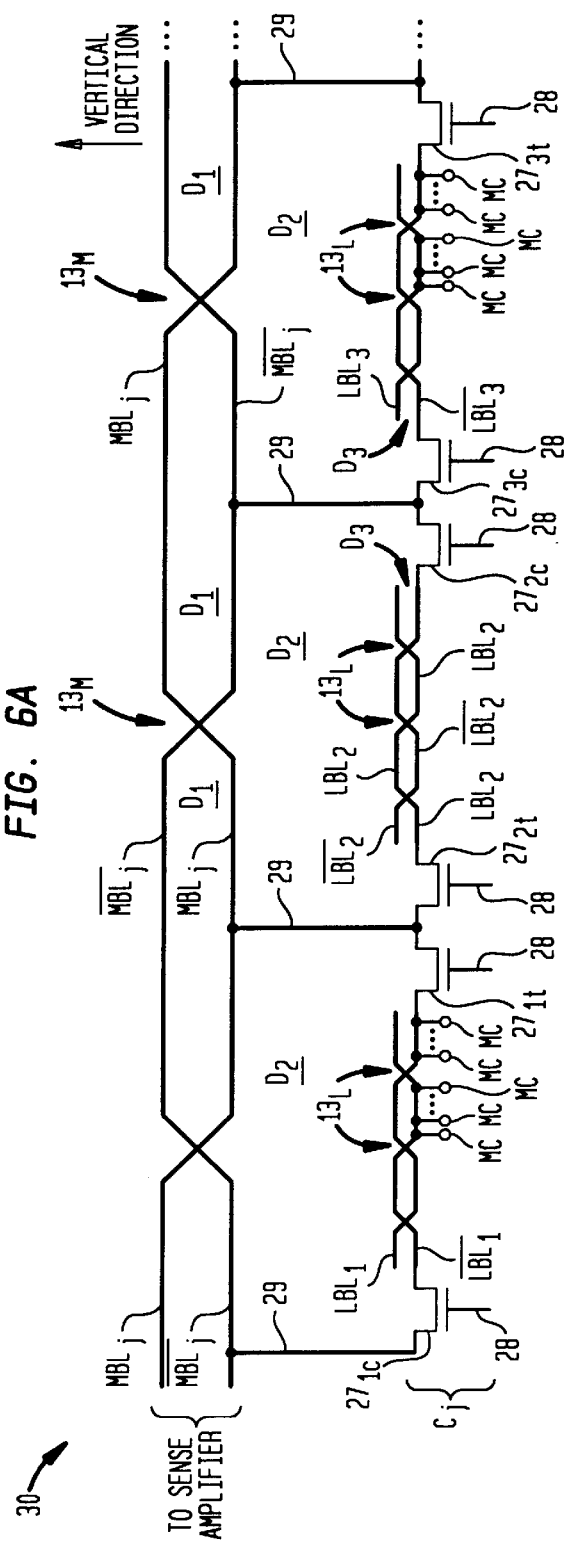
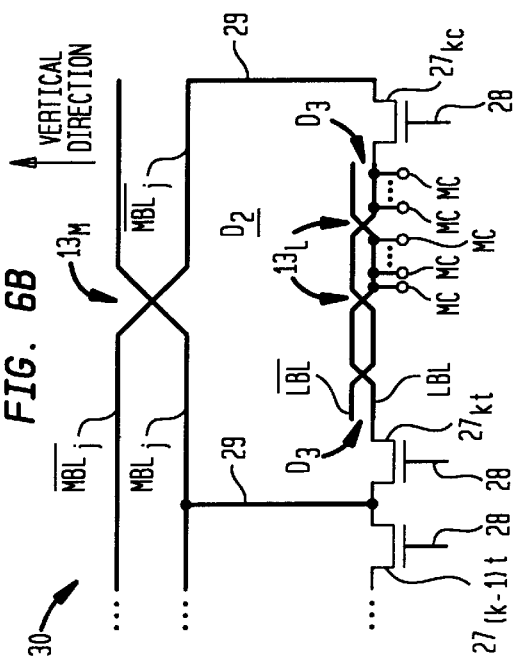
FIG. 6A
FIG. 6B

SEMICONDUCTOR MEMORY HAVING HIERARCHICAL BIT LINE AND/OR WORD LINE ARCHITECTURE

FIELD OF THE INVENTION

The present invention relates to semiconductor memories such as dynamic random access memories (DRAMs), and more particularly, to a semiconductor memory having a hierarchical bit line and/or word line architecture.

BACKGROUND OF THE INVENTION

The hierarchical or "segmented" bit line architecture was developed several years ago in order to increase the integration density of memory chips. This architecture allows for a reduced number of space-consuming sense amplifiers for a given number of memory cells, thus reducing chip size or increasing memory capacity for a given size chip.

FIG. 1 illustrates a conventional hierarchical bit line architecture of a semiconductor memory. In any given column $C_j$ of the memory cell array, a master bit line $MBL_j$ is selectively connected to one of a number of local bit lines, e.g. $LBL_i$ to $LBL_{i+3}$. Each master bit line (MBL) is composed of a high conductivity metal and is located at a higher fabrication layer than the local bit lines (LBLs), i.e., it is vertically spaced from the local bit lines, where "vertical", as used herein, is the direction perpendicular to the major surface of the memory cell array. Each local bit line is directly connected to typically several hundred memory cells MC, each consisting of an access transistor 18 and a storage cell 16. The memory cells are disposed at a lower layer than the local bit lines. A word line (not shown) in each row such as $R_i$, $R_{i+1}$ connects to the gates of all transistors 18 in that row to selectively activate memory cells to be accessed. A control line 17 selectively connects an associated LBL to the MBL, such that in any given column, only one of the LBLs is connected to the MBL to access (read, write or refresh) memory cells coupled to that LBL.

The master bit line connects to one input of a sense amplifier for that column. In what is known as a folded hierarchical bit line architecture, each column includes master bit line pair consisting of a "true" master bit line and a "complementary" master bit line running in parallel to one another on the same side of the sense amplifier. The sense amplifier amplifies a differential voltage between the true and complementary MBLs to provide solid logic levels for readout and refresh operations. Both master bit lines of the pair are coupled to a plurality of associated local bit lines, as shown in FIG. 1 (i.e., the MBL shown may be either a true MBL or a complementary MBL). To access a memory cell coupled to the true MBL, both MBLs are precharged to a reference voltage, and then the word line connected to that cell is then raised to modify the voltage on the corresponding master bit line in accordance with the charge stored in that memory cell. The sense amplifier then amplifies the differential voltage between the MBL pair. An analogous procedure is performed to access cells coupled to the complementary MBL.

In an "open" hierarchical bit line configuration, operation is basically the same as the folded architecture, except that the true MBL runs on one side of the sense amplifier, and the complementary MBL extends on the opposite side.

In general, bit line capacitance is proportional to bit line length. As such, bit line length is limited by the maximum bit line capacitance that can be tolerated. The maximum capacitance is generally determined by the allowable sensing margin and the power dissipation. With the hierarchical bit line architecture, the master bit line capacitance per unit length is less than the local bit line capacitance per unit length, since the LBLs are directly coupled to the memory cells which significantly contribute to the LBL capacitance, whereas the MBLs are not directly coupled to the cells. Thus, for a given column length, the total capacitance can be significantly less than in a non-hierarchical layout (i.e., layouts with only one layer of bit lines, each extending the entire column length and directly coupled to the memory cells). Therefore, by using a hierarchical architecture, less space-consuming sense amplifiers are needed for a chip with a specific number of memory cells. That is, the architecture permits each sense amplifier to be used for more cells, coupled to the local bit lines and one long master bit line, thereby reducing the number of sense amplifiers per chip. A smaller chip size is thus possible, provided that the area allocated to the switches 14 and additional control circuitry does not exceed the area saved by reducing the number of sense amplifiers.

Recently, a high density DRAM referred to as a "diagonal bit line" (DBL) DRAM has been developed. With the DBL-type DRAM, the effective cell size is nearly $6F^2$, where F is the minimum feature size of the processing technology. An example of a diagonal bit line type DRAM is disclosed in an article entitled "FA 14.6: A 1 Gb DRAM for File Applications", by T. Sugibayashi et al., ISSC95/Session 14. That article discloses a DRAM using an open bit line architecture. The open bit line architecture, however, is more susceptible to noise-related problems than a folded bit line architecture.

FIG. 2 illustrates a folded bit line structure in which the folded bit lines run on top of one another, vertically spaced from each other by a dielectric layer, as opposed to running side by side in parallel at the same fabrication layer. The shown configuration is particularly suitable for use with cells smaller than $8F^2$. In order to facilitate access to the cells, a true bit line BL and a complementary bit line BL run on top of one another, alternately overlying and underlying each other. Memory cells MC in the different portions of the column $C_j$ are always coupled to the lower of the bit lines. At periodic regions designated as 13, the two bit lines undergo a "vertical twist", i.e. the bit lines cross over one another in the vertical direction. Each LBL segment S separating adjacent vertical twists is typically coupled to $2^N$ memory cells, e.g., eight, sixteen, thirty-two, sixty-four, etc. It is noted that in FIG. 2, the bit lines are shown generally linear. For some diagonal cell designs, however, the bit lines run in a zigzag type pattern, changing horizontal direction each time that a vertical twist occurs.

An example of a memory cell array employing vertical twists for the bit lines is disclosed in co-pending U.S. patent application Ser. No. 08/884,853, attorney docket numbers 96E9190US and FI8960449, by John DeBrosse et al., filed Jun. 30, 1997, assigned to the assignee herein and incorporated herein by reference in its entirety (hereafter, the DeBrosse et al. application).

The hierarchical concept has also been applied to the word lines of semiconductor memories. A word line configuration designed to reduce memory cell access time (RC time constant of the word line) is referred to herein as a dual word line configuration.

FIG. 3 illustrates one example of a dual word line configuration, referred to as a "segmented" dual word line architecture. A master word line in the "ith" row $R_i$ is driven by a word line driver which is part of the row decoder of the memory. The master word line overlies associated local word lines $LWL_{i1}$–$LWL_{ix}$ in row $R_i$ on a different vertically-spaced layer, with a suitable dielectric layer separating the two layers. The local word lines are directly connected to the gates of the access transistors within memory cells MC in row $R_i$. The master word line is composed of a low resistivity metal such as aluminum whereas the local word lines are typically composed of highly doped polysilicon with a silicide layer on top. A local word line driver 15 is coupled between each local word line and the master word line. Each local word line driver operates to drive the associated local word line to permit selective access of the cells coupled to that local word line.

FIG. 4 illustrates another type of dual word line configuration, referred to as a "stitched" architecture. The stitched architecture differs from the segmented architecture in that the local word line drivers are replaced by electrical via hole contacts or "stitches" 19 between the master word line $MWL_i$ and the local word lines $LWL_{1i}$ to $LWL_{xi}$. The local word lines may all be electrically connected as shown. With either the stitched or segmented architectures, the total resistance in the path to any given memory cell is substantially reduced. With lower word line resistance, the RC time constant associated with each word line is reduced, thereby speeding up memory cell access time. The segmented architecture has the additional advantage of reduced word line capacitance; however, a drawback to the segmented approach is the additional complexity and space required for the local word line drivers.

SUMMARY

The present disclosure relates to a semiconductor memory having a hierarchical bit line and/or word line architecture. In one embodiment, a memory having a hierarchical bit line architecture, particularly suitable for use with cells smaller than $8F^2$, includes a master bit line pair in each column, including first and second master bit lines with portions vertically spaced from one another. The first and second master bit lines twist with respect to one another in the vertical direction, such that the first master bit line alternately overlies and underlies the second master bit line. A plurality of local bit line pairs in each column are coupled to memory cells, with at least one of the local bit lines operatively coupled to a master bit line, e.g., via switches that selectively couple the local bit lines to the master bit line.

In another embodiment, a semiconductor memory having a hierarchical word line configuration includes a plurality of master word lines, each associated with at least one row. At least one sub-master word line is operatively coupled to each master word line, and a plurality of local word lines are operatively coupled to each sub-master word line. Either a plurality of electrical contacts, a plurality of switches or a plurality of electrical circuits interconnect the local word lines to the sub-master word lines and the sub-master word lines to the associated master word line.

BRIEF DESCRIPTION OF THE DRAWINGS

Embodiments of the present invention will now be described in reference to the drawings, in which like reference numerals depict similar or identical features throughout the drawings, wherein:

FIGS. 5 and 6A–6B illustrate embodiments of a hierarchical bit line structure in accordance with the present invention.

DETAILED DESCRIPTION OF THE INVENTION

The present disclosure relates to improved hierarchical bit line and word line architectures for semiconductor memories. Disclosed are ways to extend the hierarchical concept to folded bit lines employing periodic vertical twists and/or to realize additional tiers for dual word lines. For purposes of discussion, exemplary embodiments of the invention are described in the context of a DRAM chip. The invention however has broader applications. Merely by way of example, the invention has application in other memory devices such as EDO-DRAM, SDRAM, RAMBUS-DRAM, SLDRAM, MDRAM, SRAM, flash RAM, EPROM, EEPROM, or mask ROM.

Figure 5:
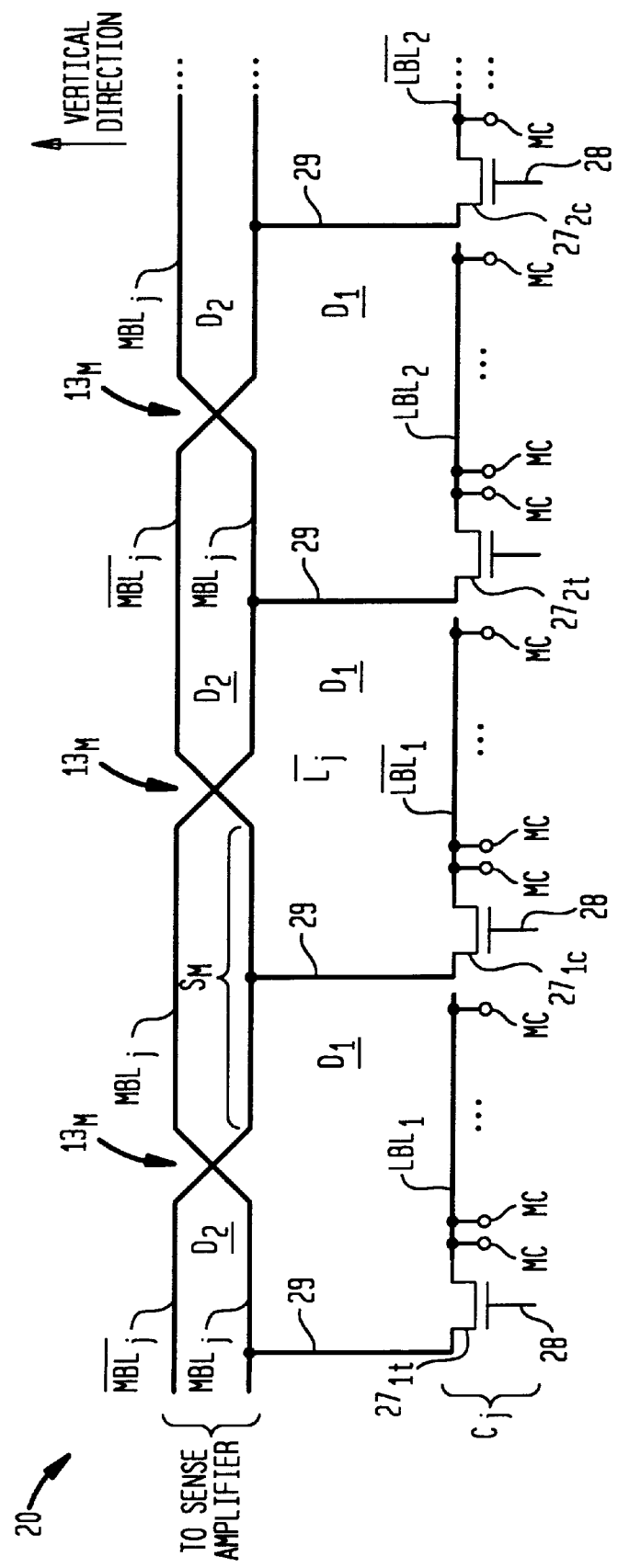

Referring now to FIG. 5, a first embodiment of the present invention is illustrated in a schematic cross-sectional view. This embodiment is a hierarchical bit line architecture particularly suitable for use with small, densely packed memory cells such as $<8F^2$ cells of a DRAM. Bit line structure 20 includes, in each column $C_j$ of the memory cell array, a plurality of local bit lines such as $LBL_1$, $\overline{LBL}_1$, $LBL_2$, $\overline{LBL}_2$ at a fabrication layer M0, and a master bit line pair comprising of a true master bit line $MBL_j$ and a complementary master bit line $\overline{MBL}_j$ alternating between higher fabrication layers. Vertical twists periodically occur at the regions $13_M$ such that the true MBL alternately overlies and underlies the complementary MBL. A dielectric layer D2 separates the MBL pair.

At a region of each segment $S_M$ of the lower master bit line MBL or $\overline{MBL}$, an electrical via hole contact 29 extends down through dielectric layer D1. Each contact 29 connects to the drain or source of an FET switch $27_{xx}$, which connects to a local bit line. The switching state of each switch $27_{xx}$ is controlled by an associated control line 28 running in the row direction, where each control line 28 is preferably connected to all switches $27_{xx}$ aligned in the row direction. The true master bit line $MBL_j$ is selectively coupled to a true local bit line $LBL_i$ via a switch $27_{it}$, whereas $\overline{MBL}_j$ is selectively coupled to a complementary local bit line $\overline{LBL}_i$ via a switch $27_{iC}$. To access a memory cell MC coupled to a true LBL such as $LBL_1$, the true and complementary MBLs are first precharged to an equalization voltage by an equalization circuit within the sense amplifier circuitry in a conventional manner, At about the same time, switches $27_{1t}$ and $27_{1C}$ coupled to $LBL_1$ and $\overline{LBL}_1$, respectively, are closed, while the other switches $27_{xx}$ in column $C_j$ are opened via appropriate control signals on control lines 28. Once $LBL_1$ and $\overline{LBL}_1$ are sufficiently precharged, the equalization circuit is disabled and the word line connecting the selected memory cell (coupled to $LBL_1$) is raised to thereby modify the voltage on $LBL_1$ and $MBL_j$. Switch $27_{1C}$ preferably remains closed during this time to provide an optimum reference voltage on $MBL_j$. The sense amplifier then amplifies the differential voltage between the master bit line pair to provide a solid logic level for a readout or refresh operation. Likewise, to access memory cells coupled to $\overline{LBL}_1$, local bit line $LBL_1$ is used to provide the reference voltage to the sense amplifier while the word line connected to the selected cell coupled to $\overline{LBL}_1$ is raised.

Figure 11:
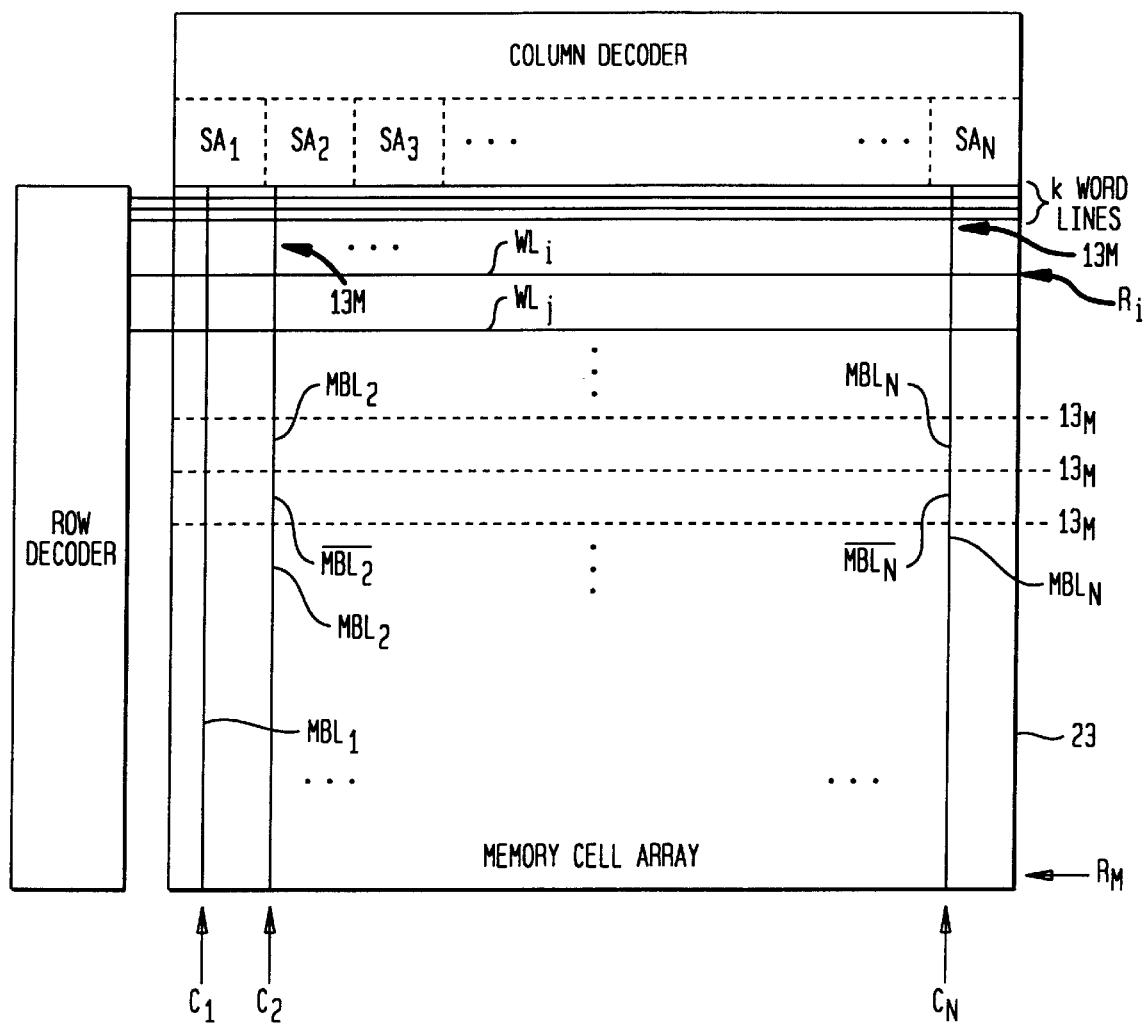
FIG. 11 is a schematic plan view of a memory cell array with linear bit lines.
Figure 12:
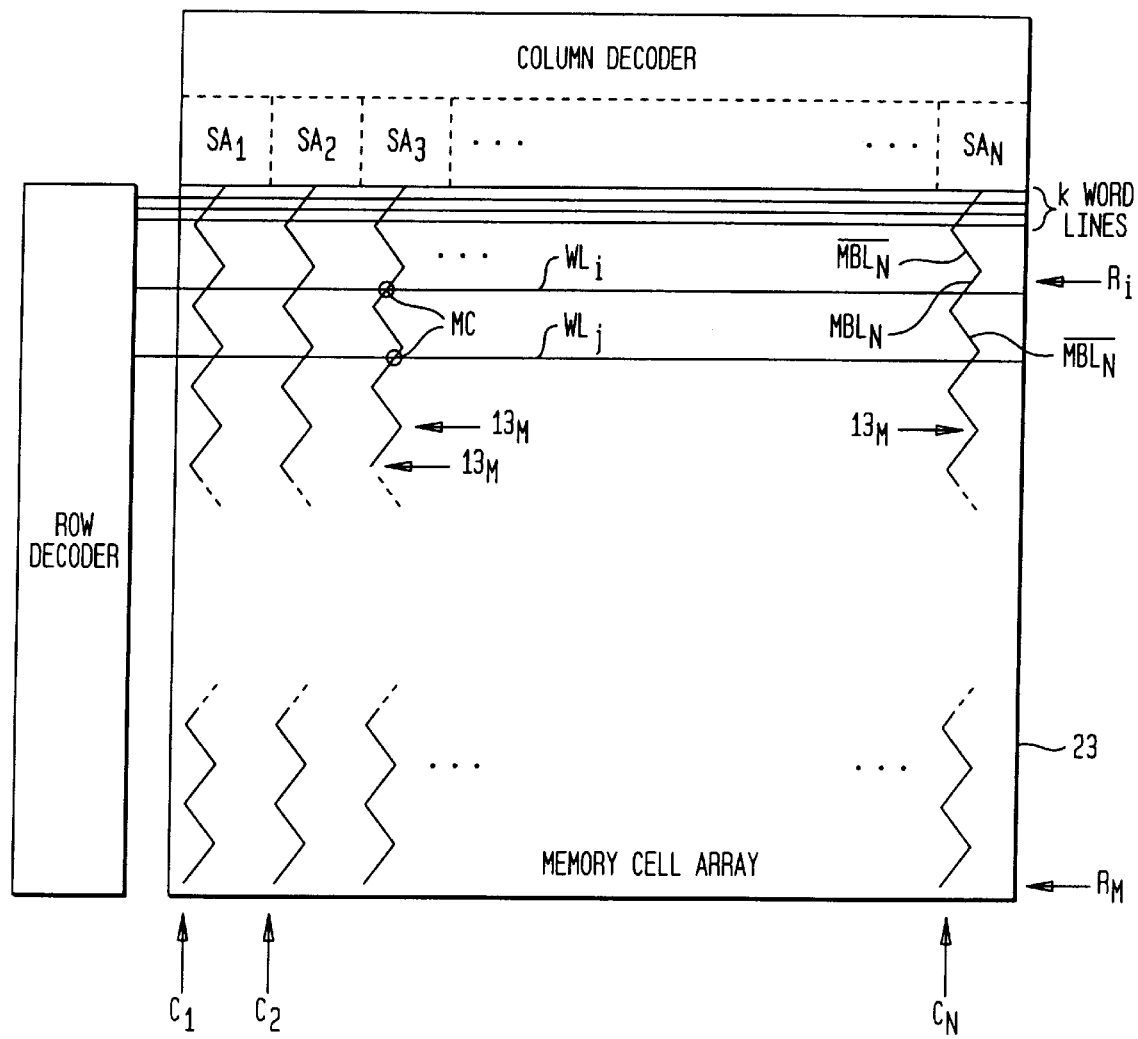
FIG. 12 is a schematic plan view of a memory cell array with diagonal bit lines.

In the horizontal plane (i.e., the plane of the major surface of the memory cell array, perpendicular to the paper in FIG. 5) the local bit lines may run linearly in the column direction as shown in FIG. 11. The master bit liens periodically undergo vertical twists at regions $13_M$. In this example, the master bit lines $MBL_1$–$MBL_N$ be considered as running directly over the local bit lines. A plurality K of word lines run between adjacent vertical twist regions $13_M$. The sense amplifiers $SA_1$–$SA_N$ are operatively coupled to the respective master bit lines $MBL_1$–$MBL_N$ and $\overline{MBL}_1$–$\overline{MBL}_n$. Row and column decoders are provided adjacent the memory cell array in a conventional manner. If diagonal bit line cells are employed, the local bit lines will run in substantially a zigzag type pattern in the horizontal plane to facilitate access to the drain terminals of the memory cell access transistors. A schematic plan view of an exemplary memory cell array with diagonal cells employing bit lines running in a zigzag type pattern is shown in FIG. 12.

Figure 1:
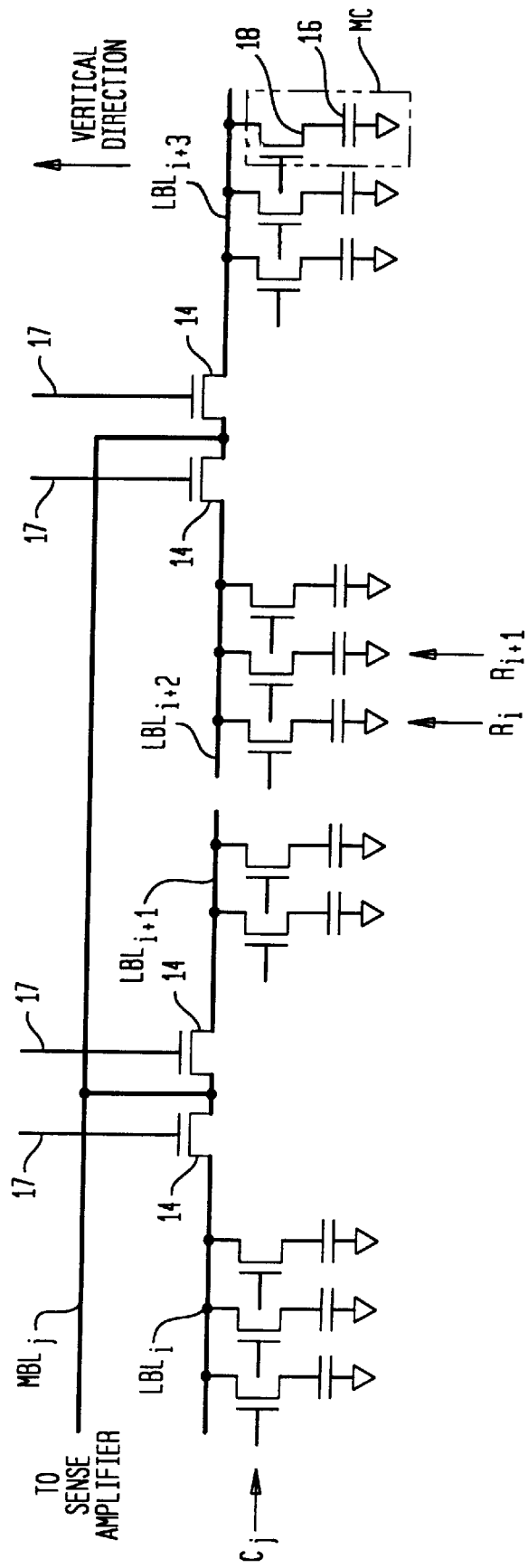
FIG. 1 illustrates a prior art hierarchical bit line configuration.
Figure 2:
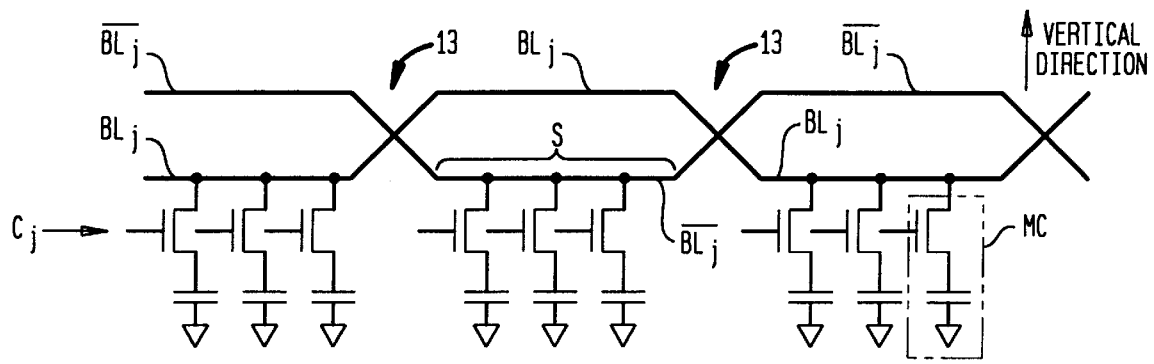
FIG. 2 illustrates a prior art folded bit line configuration having periodic vertical twists.

The hierarchical bit line structure 20 allows for higher integration density relative to the prior art, particularly for memories employing cells smaller than $8F^2$. It is understood, however, that the bit line structures disclosed herein can also be utilized with memories having cells larger than $8F^2$. In addition, the local bit line pairs need not be complementary as in folded bit line architectures. In any case, integration density is improved with the architecture of FIG. 5 as compared to the prior art configuration of FIG. 2 since each sense amplifier can be used for more memory cells. That is, the total bit line capacitance of one local bit line and one long master bit line is significantly less than it would otherwise be in a non-hierarchical configuration. Thus, the columns of memory cells associated with each sense amplifier can be made longer, requiring less sense amplifiers per chip.

Referring now to FIGS. 6A and 6B, an alternative embodiment of a hierarchical bit line architecture in accordance with the present invention is illustrated in a cross sectional schematic view. FIGS. 6A and 6B show opposite ends of bit line structure 30. Bit line structure 30 differs from the aforedescribed bit line structure 20 in that the local bit line pairs also undergo vertical twists at the regions designated $13_L$. Vertical twists $13_L$ may be implemented using essentially the same technique used to fabricate the vertical twists $13_M$ for the master bit lines. Each LBL pair such as $LBL_1$ and $\overline{LBL}_1$ alternately overlie and underlie one another, and are vertically separated by a dielectric layer $D_3$. Hence, bit line structure 30 has an additional metal layer as compared to bit line structure 20.

The first electrical contact 29 nearest the sense amplifier connects $\overline{MBL}_j$ to the drain or source of a first LBL switch $27_{1C}$, where the other side of switch $27_{1C}$ connects to the first complementary local bit line $\overline{LBL}_1$. Local bit lines $LBL_1$ and $\overline{LBL}_1$ undergo several vertical twists with respect to each other at regions $13_L$. On the other side, $LBL_1$ connects to switch $27_{1t}$. Another contact 29 connects switch $27_{1t}$ to the true master bit line $MBL_j$. As such, the true master bit line is selectively connected only to one of the true local bit lines $LBL_1$ to $LBL_K$, and $\overline{MBL}_j$ selectively connects only to one of $\overline{LBL}_1$–$\overline{LBL}_K$. To access a memory cell coupled to $LBL_1$ or $\overline{LBL}_1$, for example, both switches $27_{1t}$ and $27_{1C}$ would be closed while the other switches $27_{xx}$ in column $C_j$ would all be opened. The word line coupled to the selected cell (coupled to $LBL_1$ or $\overline{LBL}_1$) would be raised. For a folded bit line architecture, $\overline{LBL}_1$ would be used to supply the precharge reference voltage to the sense amplifier via $\overline{MBL}_j$ if the selected cell is coupled to $LBL_1$, and vice versa for a cell coupled to $\overline{LBL}_1$. However, as explained above, reference cells in the sense amplifier can alternatively be employed to supply the reference voltage in non-folded type architectures. In this case, only one of the switches $27_{xx}$ would be closed at any given time to access the memory cells associated with that switch.

The bit line structure 30 of FIGS. 6A–6B can be modified by connecting only the first local bit line pair $LBL_1$, $\overline{LBL}_1$ directly to the sense amplifier, while the other LBL pairs remain operatively coupled to the sense amplifier via the master bit line pair. This may be implemented by removing the first electrical contact 29 connecting $\overline{MBL}_j$ to switch $27_{1C}$, connecting one end of switch $27_{1C}$ directly to the sense amplifier, and moving switch $27_{1t}$ to a position coupled between the sense amplifier and $LBL_1$. In conjunction with this approach, another pair of switches may be added, with one switch coupled between one sense amplifier input terminal and the true master bit line and the other switch coupled between the other sense amplifier input terminal and the complementary master bit line. Thus, whenever the first LBL pair $LBL_1$, $\overline{LBL}_1$ is to be accessed, this additional pair of switches would be switched off to disconnect the master bit line pair from the sense amplifier.

Figure 7:
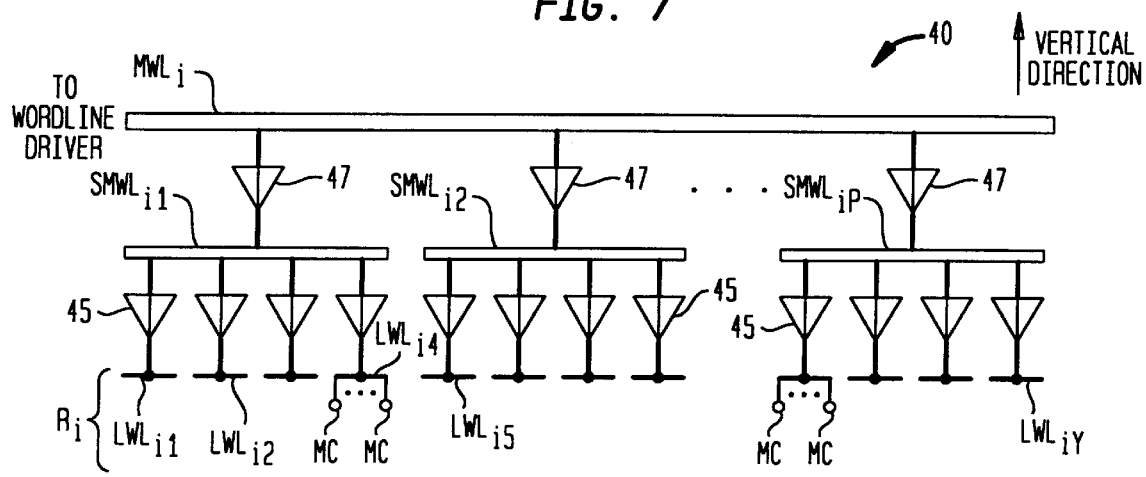
FIG. 7 illustrates an embodiment of a hierarchical word line configuration employing a segmented architecture in accordance with the present invention.

Turning now to FIG. 7, a segmented-type hierarchical word line structure 40 in accordance with present invention is schematically illustrated. As is the case for the other embodiments disclosed herein, word line structure 40 may be part of a DRAM or other semiconductor memory. In each row $R_i$ of the memory cell array, a plurality Y of local word lines $LWL_{i1}$–$LWL_{1Y}$ are coupled to the gates of the access transistors in the memory cells. Preferably, each local word line (LWL) is embodied as continuous gate metallization connecting the gates of many memory cells in the row, e.g. several hundred. Each LWL is coupled to a local word line driver 45 as in a conventional segmented type dual word line architecture. Each word line driver 45 may include additional select circuitry for decoding, if desired. However, with word line structure 40, instead of each local word line $LWL_{xx}$ being selectively coupled to a single master word line (MWL) that extends along the entire row, groups of LWLs are selectively coupled to sub-master word lines $SMWL_{i1}$–$SMWL_{iP}$, each separated from one another. The sub-master word lines (sub-MWLs) are disposed at a higher fabrication layer than the local word lines. In the example of FIG. 7, four LWLs are selectively coupled to each sub-MWL; however, it is understood that more or fewer LWLs may be selectively coupled to each sub-MWL.

Each sub-master word line $SMWL_{i1}$–$SMWL_{iP}$ is selectively coupled to a single master word line $MWL_i$ in row $R_i$ via local word line drivers 47, where the circuitry of LWL drivers 47 may be essentially the same as LWL drivers 45, i.e., conventional LWL drivers. The precise layout of the LWL drivers and their method of fabrication is not critical to the present invention—many suitable layouts are possible as will be apparent to those skilled in the art. Each local word line driver 45 or 47 can be considered part of a local word line driver driving multiple rows, as will become apparent below.

Figure 3:
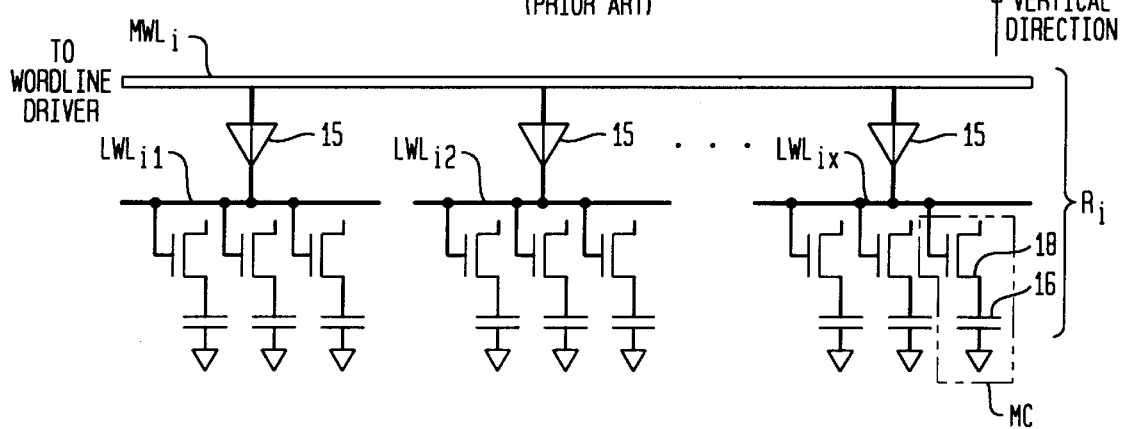
FIG. 3 shows a prior art segmented-type dual word line configuration.
Figure 4:
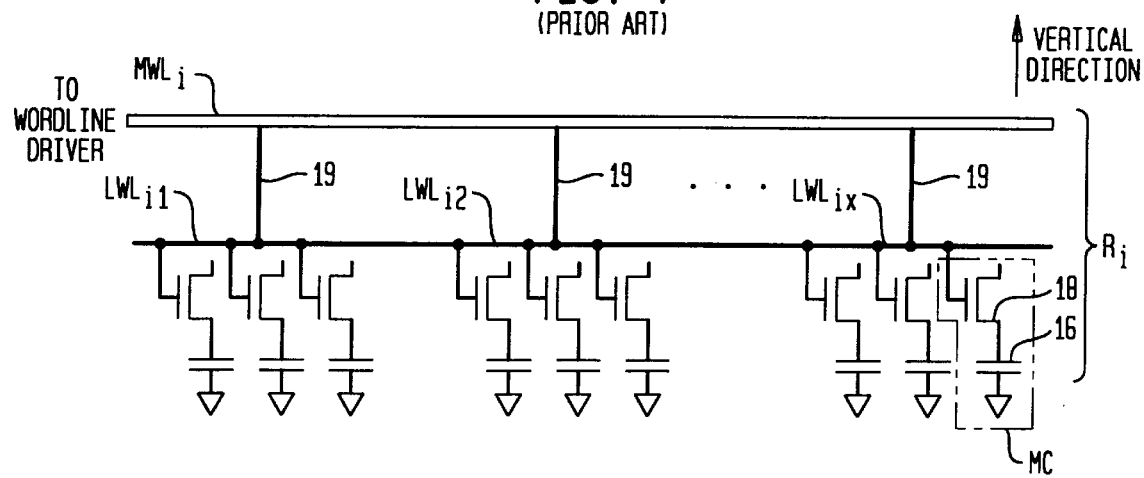
FIG. 4 shows a prior art stitched-type dual word line configuration.

Word line structure 40 will afford faster memory cell access time as compared to conventional segmented-type dual word line structures, such as that shown in FIG. 3 herein. Faster access time is achievable since the number of local word line drivers directly connected to the master word line is reduced. Consequently, the capacitive load on the MWL decreases significantly, reducing the RC time constant. By way of example, in the circuit of FIG. 7, the MWL is directly connected to one fourth the number of local word line drivers as compared to the prior art.

Figure 8:
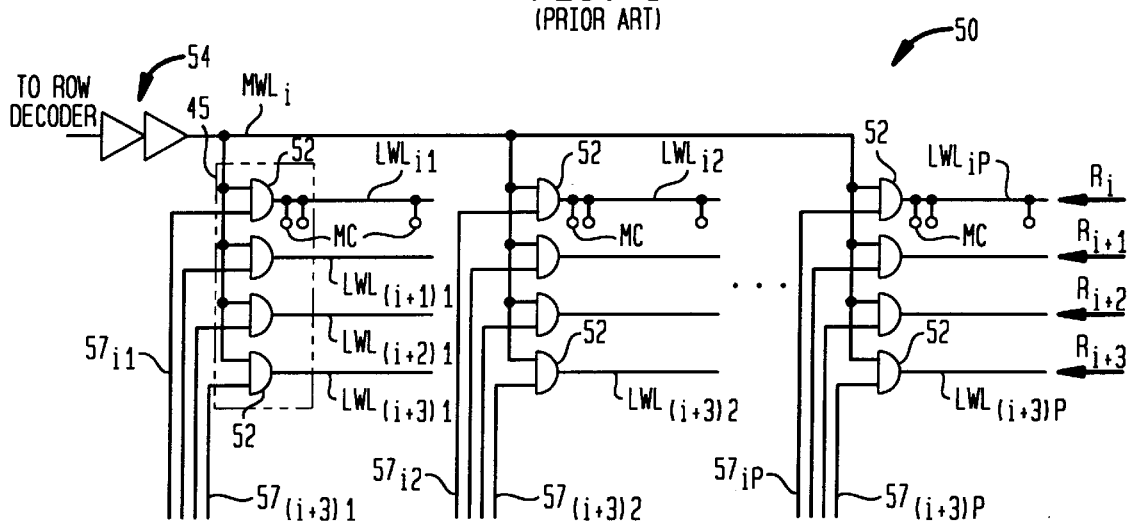
FIG. 8 illustrates a segmented type dual word line architecture.

FIG. 8 schematically illustrates a prior art segmented-type dual word line structure 50 in which each master word line MWL is used to provide a row activation signal to several rows. In the exemplary configuration shown, a master word line $MWL_i$ is used for four rows $R_i$ to $R_{i+3}$. $MWL_i$ is driven by a word line driver 54 associated with the row decoder used with the memory cell array. In each row such as Ri, there are P local word lines $LWL_{i1}$ to $LWL_{iP}$, with each being connected to the output of a AND gate 52. One input of each AND gate 52 is coupled to $MWL_i$ while the other input is coupled to an associated control line $57_{xx}$. Control lines $57_{xx}$ are driven by a driver within the row decoder. Four AND gates aligned in the column direction define a local word line driver 45. To access a memory cell coupled to a particular local word line such as $LWL_{i1}$, word line driver 54 drives the master word line $MWL_i$ high, and the associated control line $57_{i1}$ is driven high while each of the other control lines $57_{xx}$ are held low. Accordingly, by employing one master word line for several rows, the master word line pitch (periodic spacing between master word lines) can be relaxed, whereby the manufacturing process is easier to implement and yield is improved. Also, the line widths of the MWLs can be made wider, such that the MWL resistance is lowered, thereby speeding up memory cell access time.

Figure 9:
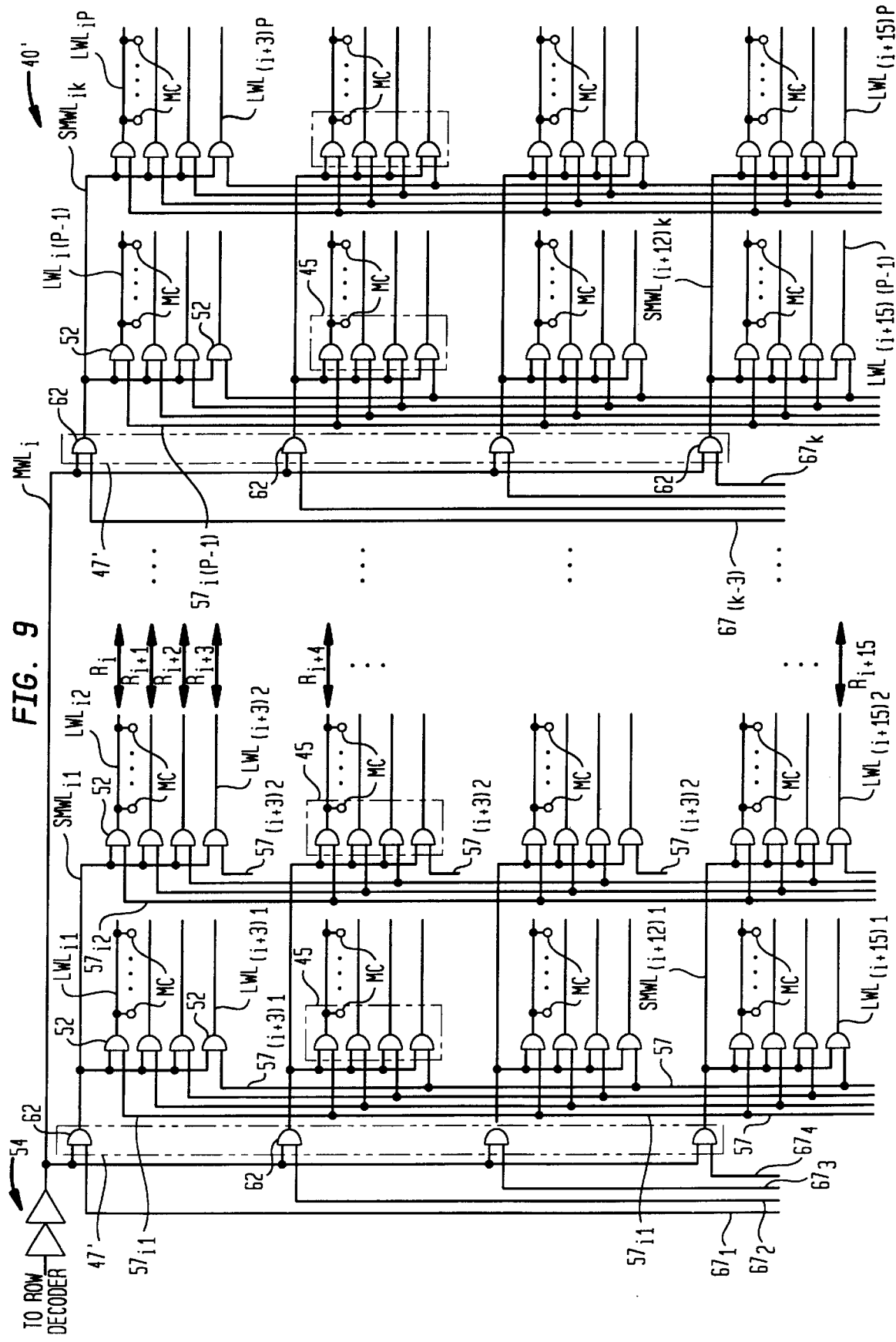
FIG. 9 illustrates an alternative hierarchical, segmented word line architecture in accordance with the invention.

FIG. 9 schematically illustrates a segmented-type word line structure 40' in accordance with the present invention, which is a special case of the word line structure 40 of FIG. 7. Word line structure 40' employs one master word line $MWL_i$ to provide row activation signals to multiple rows. In the exemplary configuration shown, master word line $MWL_i$ is used for 16 rows $R_i$ to $R_{i+15}$. Each row includes P local word lines $LWL_{i1}$–$LWL_{iP}$ composed of gate metallization. Each local word line is coupled to the output of an AND gate 52 as in the aforedescribed word line configuration of FIG. 8. One input terminal of each AND gate 52 is coupled to a sub-master word line, e.g. $SMWL_{i1}$, while the other input terminal is coupled to a control line such as $57_{i1}$. Each control line $57_{xx}$ preferably connects to multiple AND gates 52 in different columns as shown. Thus, control line $57_{i1}$ may connect to the AND gates coupled to local word lines spaced four rows apart, i.e., $LWL_{i1}$, $LWL_{(i+4)1}$, $LWL_{(i+8)1}$, etc. Four AND gates 52 aligned in the column direction comprise one local word line driver 45 discussed above.

Each sub-master word line (sub-MWL) is coupled to input terminals of AND gates 52 of "Z" rows, e.g. four rows in the exemplary embodiment of FIG. 9. Each sub-MWL is coupled via the AND gates 52 to "Y" local word lines of a common row, e.g. two local word lines. There are K sub-master word lines such as $SMWL_{i1}$–$SMWL_{iK}$ for each set of Z rows in this example. Each sub-MWL connects to the output of an AND gate 62, where one input of each AND gate 62 connects to the master word line MWLi and the other input terminal connects to an associated one of control lines $67_1$–$67_K$. In this example, four AND gates 62 aligned in the column direction comprise one local word line driver 47¢, which is an embodiment of word line driver 47 of FIG. 7. Control lines $67_1$–$67_K$ are driven high or low in accordance with the row and column address by suitable control electronics known in the art. Thus, to access a memory cell coupled to a particular local word line such as $LWL_{i2}$, the AND gate 52 connected to $LWL_{i2}$ has its output driven high by driving control lines $57_{i2}$ and $67_1$ high, while all the other control lines $57_{xx}$ and $67_2$–$67_K$ are held low and $MWL_i$ is driven high.

Accordingly, with the hierarchical word line structure 40¢, each master word line as MWLi provides row activation signals to a larger number of rows than is possible with the dual word line configuration of FIG. 8. Consequently, the master word lines can be made wider, thus lessening the master word line resistance and reducing RC access time. Also, the master word line pitch can be increased to facilitate the word line manufacturing process and improve chip yield.

Figure 10:
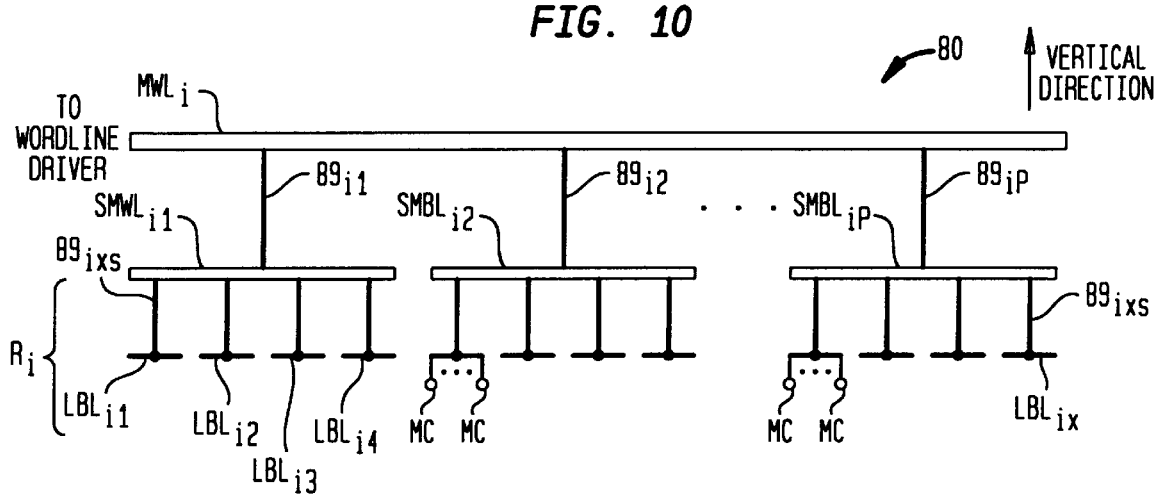
FIG. 10 illustrates a stitched type hierarchical word line architecture in accordance with the invention.

With reference now to FIG. 10, a stitched-type hierarchical word line structure 80 in accordance with the present invention is schematically illustrated. A plurality X of local word lines $LWL_{i1}$ to $LWL_{ix}$ are disposed in any row Ri of the memory cell array. The local word lines (LWLs) are either separated from one another, as shown, or electrically connected as one continuous gate metallization along the entire row Ri. Electrical via hole contacts (stitches) $89_{i1S}$ to $89_{ixS}$ periodically connect the LWLs to sub-master word lines $SMWL_{i1}$ to $SMWL_{iP}$ at a higher fabrication level. Electrical via hole contacts $89_{i1}$ to $89_{iP}$ connect the respective sub-master word lines to a master word line $MWL_i$ at a higher level. The spacing between adjacent ones of contacts $89_{i1}$ to $89_{iP}$ is larger than the spacing between adjacent ones of contacts $89_{i1S}$ to $89_{ixS}$. From the foregoing, thus disclosed are hierarchical bit line and word line architectures for semiconductor memories. While the above description contains many specifics, these specifics should not be construed as limitations on the scope of the invention, but merely as exemplifications of preferred embodiments thereof. For example, the embodiments of the hierarchical word line configurations disclosed herein can be used in conjunction with any of the hierarchical bit line configurations described above. Those skilled in the art will envision many other possible variations that are within the scope and spirit of the invention as defined by the appended claims.

What is claimed is:

1. A semiconductor memory having a memory cell array of memory cells arranged in rows and columns, comprising:

a master bit line pair in each column, comprising first and second master bit lines with portions of the first and second master bit lines being vertically spaced from one another, and the first and second master bit lines twisting with respect to one another in the vertical direction such that the first master bit line alternately overlies and underlies the second master bit line, said vertical direction being perpendicular to a major surface of the memory cell array, the first and second master bit lines remaining substantially parallel in vertical planes;

a plurality of local bit line pairs in each column coupled to memory cells, with at least one of the local bit lines operatively coupled to a master bit line and a hierarchical word line configuration comprising a plurality of master word lines, each associated with at least one row, at least one sub-master word line operatively coupled to each said word line, and a plurality of local word lines coupled to said memory cells and operatively coupled to the sub-master word line.

2. The semiconductor memory of claim 1, wherein a folded bit line architecture is employed, said first and second master bit lines comprise true and complementary master bit lines, respectively, and at least one of the local bit line pairs in a column having a true local bit line operatively coupled to the true master bit line and a complementary local bit line operatively coupled to the complementary master bit line of the column.

3. The semiconductor memory of claim 1, wherein a first local bit line of a given local bit line pair is operatively and selectively coupled to said first master bit line through a first switch and a second local bit line of the given local bit line pair is operatively and selectively coupled to the second master bit line via a second switch.

4. The semiconductor memory of claim 1, wherein plural of said local bit line pairs in each column are selectively coupled to the master bit line pair of the column via respective switches.

5. The semiconductor memory of claim 2, wherein the true and complementary local bit lines are disposed in alternating positions in the column direction.

6. The semiconductor memory of claim 2, wherein the true and complementary local bit lines periodically undergo a vertical twist with respect to one another such that the true and complementary local word lines alternately overlie and underlie one another in the vertical direction.

7. The semiconductor memory of claim 1, wherein said memory cells are $8F^2$ or smaller memory cells.

8. The semiconductor memory of claim 1, wherein said memory cells are larger than $8F^2$ memory cells.

9. A semiconductor memory having a memory cell array of memory cells arranged in rows and columns, comprising:

a master bit line pair in a column, the master bit line pair comprising first and second master bit lines with portions of the first and second master bit lines being vertically spaced from one another, and the first and second master bit lines twisting with respect to one another in the vertical direction such that the first master bit line alternately overlies and underlies the second master bit line, said vertical direction being perpendicular to a major surface of the memory cell array, the first and second master bit lines remaining substantially parallel in vertical planes;

a plurality of local bit line pairs in each column coupled to memory cells, with at least one of the local bit lines operatively coupled to a master bit line and a hierarchical word line configuration comprising a plurality of master word lines, wherein a master word line is associated with at least one row, at least one sub-master word line operatively coupled to the master word line, and a plurality of local word lines coupled to said memory cells and operatively coupled to the sub-master word line.

10. The semiconductor memory of claim 9, wherein a folded bit line architecture is employed, said first and second master bit lines comprise true and complementary master bit lines, respectively, and at least one of the local bit line pairs in a column having a true local bit line operatively coupled to the true master bit line and a complementary local bit line operatively coupled to the complementary master bit line of the column.

11. The semiconductor memory of claim 9, wherein a first local bit line of a given local bit line pair is operatively and selectively coupled to said first master bit line through a first switch and a second local bit line of the given local bit line pair is operatively and selectively coupled to the second master bit line via a second switch.

12. The semiconductor memory of claim 9, wherein plural of said local bit line pairs in each column are selectively coupled to the master bit line pair of the column via respective switches.

13. The semiconductor memory of claim 10, wherein the true and complementary local bit lines are disposed in alternating positions in the column direction.

14. The semiconductor memory of claim 10, wherein the true and complementary local bit lines periodically undergo a vertical twist with respect to one another such that the true and complementary local word lines alternately overlie and underlie one another in the vertical direction.

15. The semiconductor memory of claim 9, wherein said memory cells are $8F^2$ or smaller memory cells.

16. The semiconductor memory of claim 9, wherein said memory cells are larger than $8F^2$ memory cells.

* * * * *